(12) United States Patent
Hamada

(10) Patent No.: US 6,504,234 B2
(45) Date of Patent: Jan. 7, 2003

(54) SEMICONDUCTOR DEVICE WITH INTERLAYER FILM COMPRISING A DIFFUSION PREVENTION LAYER TO KEEP METAL IMPURITIES FROM INVADING THE UNDERLYING SEMICONDUCTOR SUBSTRATE

(75) Inventor: Koji Hamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/771,586

(22) Filed: Jan. 30, 2001

(65) Prior Publication Data

US 2001/0012686 A1 Aug. 9, 2001

(30) Foreign Application Priority Data

Feb. 4, 2000 (JP) ........................................ 2000-028184

(51) Int. Cl.[7] ............................................... H01L 23/58
(52) U.S. Cl. ....................... 257/636; 257/637; 257/644
(58) Field of Search ................................. 257/635, 636, 257/637, 644

(56) References Cited

U.S. PATENT DOCUMENTS

| 5,518,962 A | * | 5/1996 | Murao | 437/195 |
| 5,661,325 A | * | 8/1997 | Hayashi et al. | 257/393 |
| 5,679,982 A | * | 10/1997 | Gardner | 257/758 |
| 5,716,890 A | * | 2/1998 | Yao | 257/624 |
| 5,874,778 A | * | 2/1999 | Bhattacharyya et al. | 257/758 |
| 5,904,516 A | * | 5/1999 | Park | 438/197 |
| 6,124,622 A | * | 9/2000 | Tsutsumi | 257/506 |
| 6,278,174 B1 | * | 8/2001 | Havemann et al. | 257/637 |

FOREIGN PATENT DOCUMENTS

| JP | 56-61129 | | 5/1981 | | |
| JP | 5-13434 | | 1/1993 | | |
| JP | 6-132542 | | 5/1994 | | |
| JP | 8-264731 | | 10/1996 | | |
| JP | 8-306694 | | 11/1996 | | |
| JP | 9-199443 | | 9/1997 | | |
| JP | 09321045 A | | 12/1997 | | |
| JP | 10-22294 | | 1/1998 | | |
| JP | 10-98040 | | 4/1998 | | |
| JP | 10-125621 A | * | 5/1998 | ........... | H01L/21/28 |
| JP | 10-135153 | | 5/1998 | | |
| JP | 10-199881 | | 9/1998 | | |
| JP | 11-330023 | | 11/1999 | | |

* cited by examiner

Primary Examiner—Olik Chaudhuri
Assistant Examiner—Stephen W. Smoot
(74) Attorney, Agent, or Firm—Young & Thompson

(57) ABSTRACT

An interlayer film covering a semiconductor device formed on the semiconductor substrate has a film having ability of gettering the metal impurities invading from an upper portion of the interlayer film, and with this ability, the metal impurities are prevented from reaching the semiconductor substrate.

14 Claims, 6 Drawing Sheets

SEMICONDUCTOR DEVICE WITH INTERLAYER FILM COMPRISING A DIFFUSION PREVENTION LAYER TO KEEP METAL IMPURITIES FROM INVADING THE UNDERLYING SEMICONDUCTOR SUBSTRATE

BACKGROUND OF THE INVENTION

1. Field of the Invention

The present invention relates to a semiconductor device and a fabricating method thereof, and more particularly, to a structure of an interlayer film in a high-density semiconductor device and a fabricating method thereof.

2. Description of the Related Art

In recent years, as devices become smaller, there is apprehension that resistance is increased by reduced wiring sectional area and electromigration resistance is deteriorated due to increase in current density. For this reason, various new materials have been tried as wiring materials, and one example of the materials is Cu wire. However, since the Cu is difficult to be finely etched, a method for forming the wire using damascene process is used to form the Cu wire. A structure of the conventional semiconductor device using this Cu wire is shown in FIG. 9. An interlayer film 400 comprising silicon oxide film 407 and BPSG film 409 is formed on a semiconductor substrate 401 in which an MOS transistor is formed. The interlayer film 400 is provided with a contact hole 410 which reaches a diffusion layer 406. A W plug 412 is embedded in the contact hole 410. A Cu wire 414 is formed on the silicon oxide film 413 provided on the interlayer film 400, and a Cu plug 419 and a Cu wire 420 are formed on a silicon oxide film 416 provided on the Cu wire 414.

The Cu wire 414 is formed in such a manner that a wire groove 415 is formed in the silicon oxide film 413, Cu film is formed in the wire groove 415 and on the silicon oxide film 413, the Cu film on the silicon oxide film is removed by CMP (Chemical Mechanical Polishing), and the Cu film only in the groove 415 is left. The Cu plug 419 and the Cu wire 420 are formed by a so-called dual damascene process in which a via hole 417 and a wire groove 418 are formed in the silicon oxide film 416, Cu is embedded in the via hole 417 and the wire groove 418, and unnecessary Cu is removed by the CMP.

It is possible to form a Cu wire having low resistance and high electromigration resistance by using the damascene process.

According to the method for forming the wire using the damascene process, however, a step for removing the unnecessary portion of the wire material by the CMP to flatten is required, and with this step, it is found that the following problems are caused.

That is, in the CMP of a metal film such as Cu and W, a solution comprising slurry including ferric nitrate or the like for oxidizing metal is used in some cases. Heavy metals such as Fe, alkaline metals or Cu and the wire materials have large diffusion coefficient in silicon oxide films or semiconductor substrates. Therefore, during the CMP for forming the Cu wire, or during the subsequent cleaning step, Fe or Cu remained on the interlayer insulating film is diffused in the silicon oxide film or the BPSG film during the subsequent thermal process, and the Fe or Cu reaches the semiconductor substrate. As a result, there are problems that reduction of lifetime is caused, and reliability of the device is lowered.

Further, since the CMP is used also when the W plug 412 is formed, the same problems are caused.

A semiconductor having a diffusion-barrier film, for example, is disclosed in Japanese Unexamined Patent Publication (KOKAI) No. 8-306694. However, this film does not solve the above mentioned problems.

SUMMARY OF THE INVENTION

Thereupon, it is an object of the present invention to solve the above problems and to provide a semiconductor device having high reliability.

To achieve the above object, the present invention provides a semiconductor device comprising an interlayer film formed on a semiconductor substrate, wherein the interlayer film includes a diffusion-preventing film for preventing metal impurities invading from an upper portion of the interlayer film from reaching the semiconductor substrate.

The invention also provides a fabricating method of a semiconductor device comprising the steps of: forming, on a semiconductor substrate, a diffusion-preventing film for preventing metal impurities invading from an upper portion of the semiconductor substrate from reaching the semiconductor substrate, forming an insulating film on the diffusion-preventing film, forming a wire groove in the insulating film, forming a metal film in the wire groove and on the insulating film, and removing the metal film deposited on said insulating film by a CMP such that the metal film is remained in the wire groove to form a metal wire.

The diffusion-preventing film may be a polysilicon film, an SIPOS film or such a film doped with boron (B) or phosphorus (P).

Since at least a portion of the interlayer film is provided with the diffusion-preventing film, even if the metal impurities such as copper (Cu) used as the metal wire or Fe included slurry during the CMP invades from the upper portion of the film, the metal impurities are gettered by the diffusion-preventing film, the metal impurities do not reach the semiconductor substrate. Therefore, it is possible to prevent the characteristics of the device formed on the semiconductor substrate from being deteriorated.

DESCRIPTION OF THE PREFERRED EMBODIMENTS

Embodiments of the present invention will be described below in detail with reference to the accompanying drawings to clarify the above, the other objects, features and merit.

First Embodiment

Figure 1:
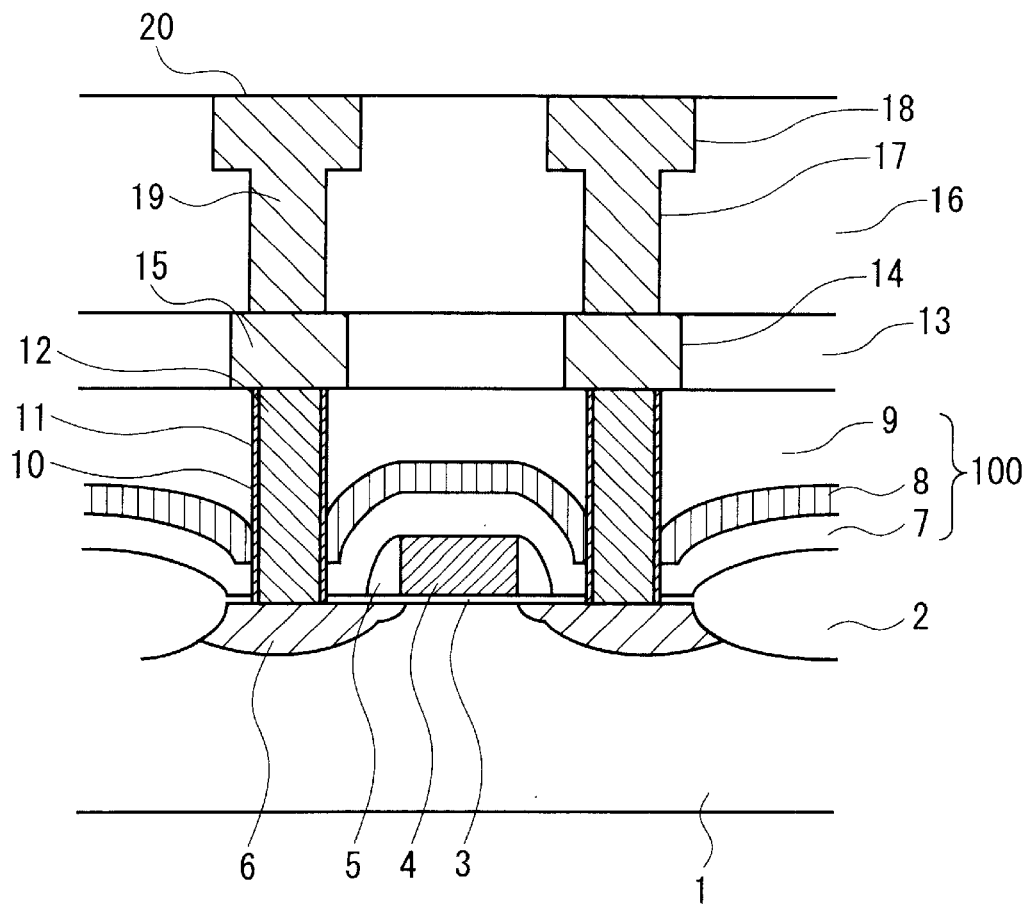
FIG. 1 is a sectional view of a structure of a semiconductor device according to a first embodiment of the present invention.

FIG. 1 is a sectional view of a semiconductor device of a first embodiment of the invention.

A device region is defined by a field oxide film 2 provided in a semiconductor substrate 1. An MOS transistor comprising a gate electrode 4, a gate oxide film 3 and source/drain diffusion layers 6 is formed in the device region. The gate electrode 4 is formed at its sidewalls with sidewall insulating films 5. An interlayer film 100 is provided for covering the MOS transistor. Contact holes 10 are provided on a diffusion layer 6 of the interlayer film 100, and W plugs 12 are embedded in the contact holes 10. The interlayer film 100 is of a three-layer structure comprising a silicon oxide film 7, a polysilicon film 8 and a BPSG film 9. Of these films, the polysilicon film 8 is a diffusion-preventing film of the present invention. Since the diffusion-preventing film is polysilicon film, contact sidewall insulating films 11 are provided on inner walls of the contact holes 10 for preventing short-circuit. Wire grooves 14 are provided above the contact holes 10 in an insulating film 13 formed on the interlayer film 100, and Cu wires 15 are provided in the wire grooves 14. Via holes 17 and wire grooves 18 are provided above the Cu wires 15 formed in the insulating film 13. A Cu plug 19 and a Cu wire 20 are provided the via hole 17 and the wire groove 18, respectively.

A fabricating method of the semiconductor device according to the first embodiment of the invention will be explained using FIGS. 2 to 7.

Figure 2:
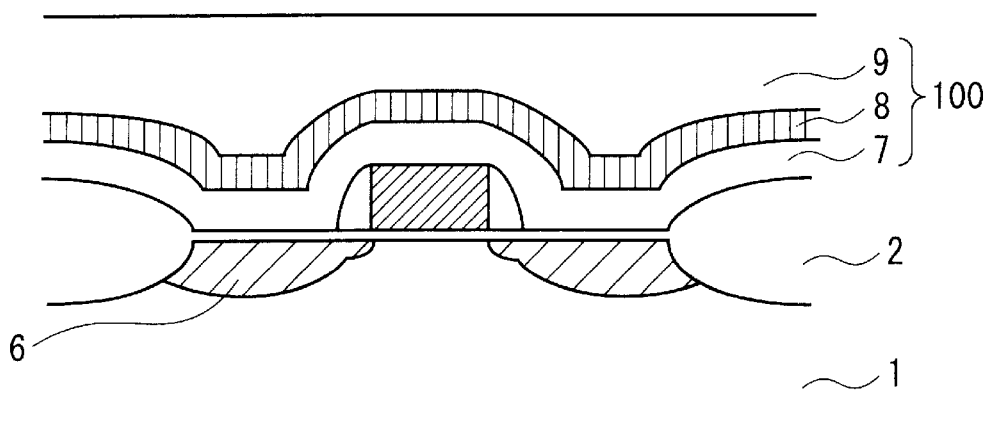
FIG. 2 is a sectional view of a step of a fabricating method of the semiconductor device according to the first embodiment of the invention.

First, as shown in FIG. 2, after the MOS transistor having the field oxide film 2 and the diffusion layer 6 is formed on the semiconductor substrate 1, the interlayer film 100 comprising the silicon oxide film 7, the polysilicon film 8 and the BPSG film 9 is deposited on the semiconductor substrate 1, and an upper surface of the BPSG film 9 is flattened by reflowing or the CMP process. It is preferable that thickness of the silicon oxide film 7 is 50 to 500 nm, thickness of polysilicon film 8 is 20 to 100 nm, and thickness of the BPSG film 9 is 100 to 1000 nm. The polysilicon film 8 is deposited by an LPCVD process using $SiH_4$ or $Si_2H_6$ as raw gas. At that time, the polysilicon film 8 may be doped with impurities such as B and P.

Figure 3:
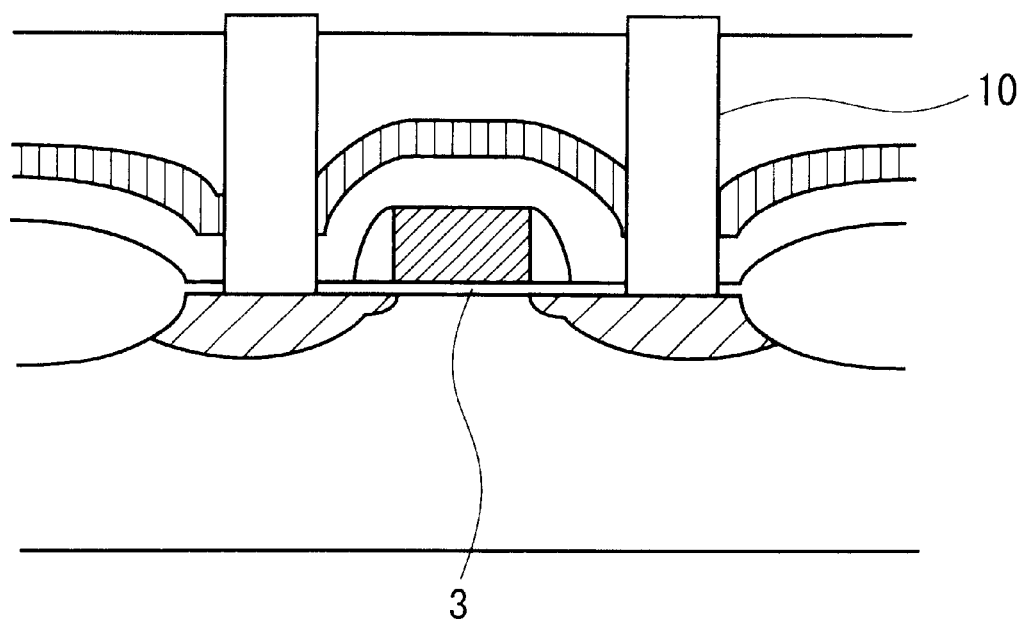
FIG. 3 is a sectional view of the step of the fabricating method of the semiconductor device according to the first embodiment of the invention.

Subsequently, as shown in FIG. 3, the contact holes 10 are formed in the interlayer film 100 and the gate oxide film 3 so that upper surfaces of the diffusion layers 6 are exposed by the lithography technique and etching technique.

Figure 4:
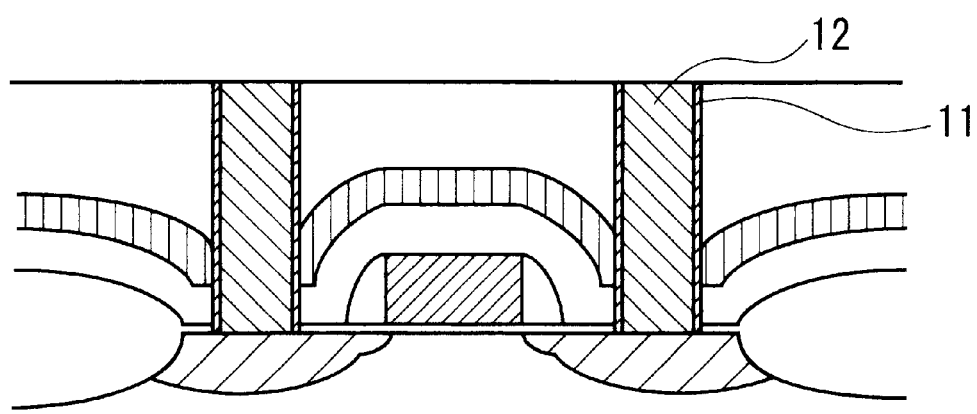
FIG. 4 is a sectional view of the step of the fabricating method of the semiconductor device according to the first embodiment of the invention.

Next, as shown in FIG. 4, silicon oxide films 11 are formed on the inner walls of the contact holes 10 as the contact sidewall insulating films by the CVD process and then, the W films are embedded in the contact holes 10, and the CMP is carried out to form the W plugs 12. When the CMP is carried out to form the W plugs, heavy metals such as Fe included in the residual slurry on the interlayer film 100 is remained even after the cleaning step. Although the heavy metals are diffused toward the semiconductor substrate 1 in the subsequent thermal step, but since the interlayer film 100 includes the polysilicon film 8 according to the present invention, the Fe passing through the BPSG film 9 is gettered due to crystal defect of the polysilicon film 8, and the Fe does not reach the semiconductor substrate 1.

Figure 5:
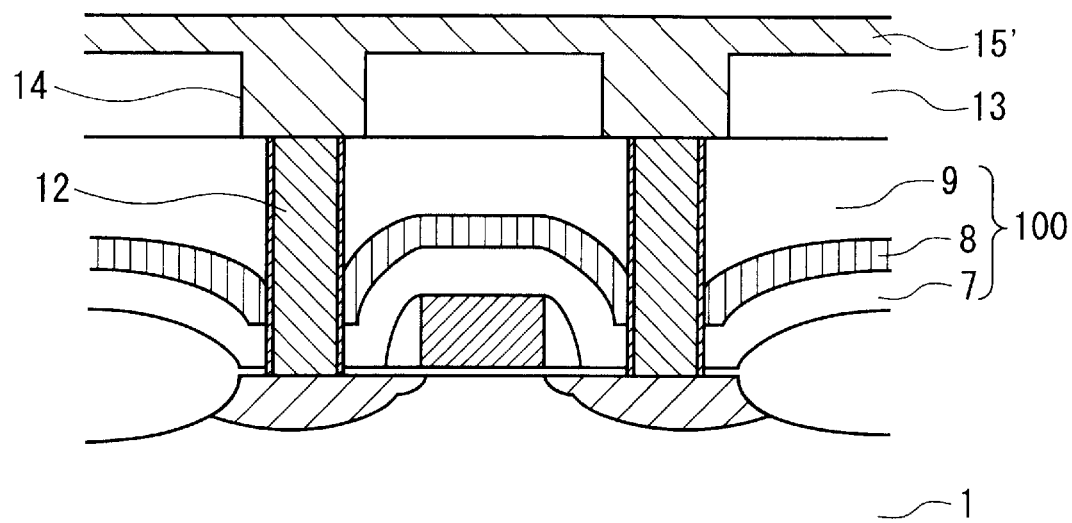
FIG. 5 is a sectional view of the step of the fabricating method of the semiconductor device according to the first embodiment of the invention.

Thereafter, as shown in FIG. 5, the silicon oxide film 13, thickness of which is 200 to 1500 nm, is deposited on the interlayer film 100, and the wire grooves 14 are formed on the W plugs of the silicon oxide film 13. Then the Cu film 15' is deposited so as to embed in the wire grooves 14. At that time, the Cu film 15' is formed also on the silicon oxide film 13.

Figure 6:
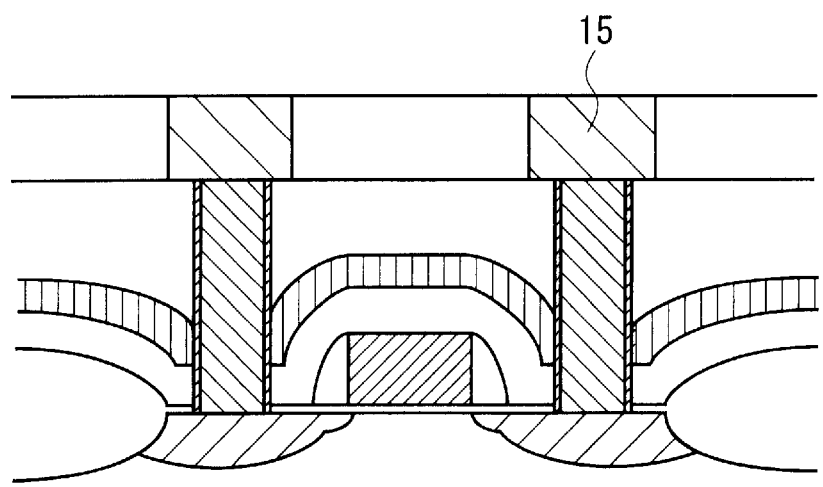
FIG. 6 is a sectional view of the step of the fabricating method of the semiconductor device according to the first embodiment of the invention.

Subsequently, unnecessary Cu film 15' deposited on the silicon oxide film 13 is removed by the CMP using slurry including ferric nitrate, and Cu film is left only in the wire grooves 14, thereby forming the Cu wires 15 as shown in FIG. 6. At that time, as is the case when the W plugs are formed, the Cu which is heavy metal, alkaline metal and wire material such as Fe included in the slurry remained on the silicon oxide film 13 diffuse toward the substrate 1 in the subsequent thermal step, but since the interlayer film 100 includes the polysilicon film 8, Fe and Cu which have passed through the BPSG film 9 are gettered due to crystal defect of the polysilicon film 8, and the Fe and Cu are prevented from reaching the substrate 1.

Figure 7:
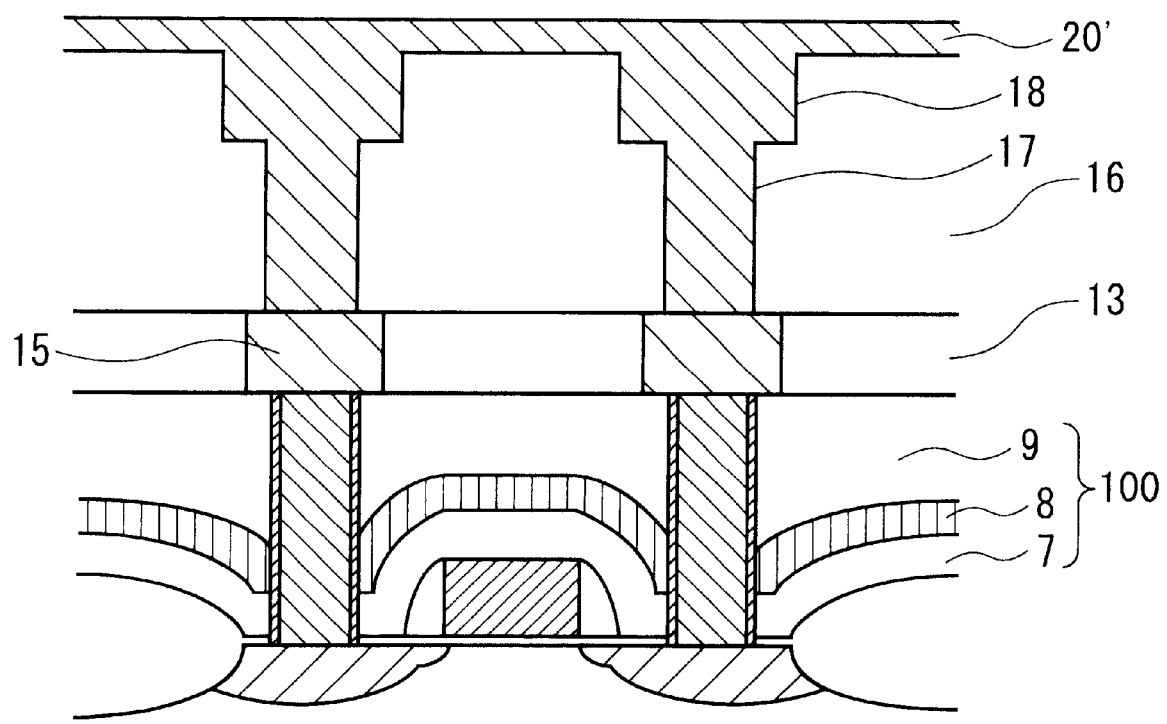
FIG. 7 is a sectional view of the step of the fabricating method of the semiconductor device according to the first embodiment of the invention.

Next, as shown in FIG. 7, a silicon oxide film 16, thickness of which is 200 to 1000 nm, is formed on the silicon oxide film 13, the via holes 17 and the wire grooves 18 are formed in the silicon oxide film 16 by the lithography technique and etching technique, and a Cu film 20' is formed such as to embed the via holes 17 and the wire grooves 18. Then, as is the case when the wires 15 are formed, unnecessary portion of the Cu film 20' is removed by the CMP using slurry including ferric nitrate, thereby forming the Cu plugs 19 and the Cu wires 20 as shown in FIG. 1. In the CMP of this step also, Cu of the heavy metal, alkaline metal and wire material such as Fe included in the slurry remains on the silicon oxide film 16, and the Cu diffuse toward the substrate through the silicon oxide films 16, 13 and the BPSG film 9 in the subsequent thermal step, these metal impurities are gettered because the polysilicon film 8 exists and thus, the metal impurities are prevented from being diffused toward the substrate.

In this embodiment, when polysilicon film including B or P is used as the diffusion preventing film 8, since such polysilicon film has higher gettering ability with respect to heavy metal as compared with non-doped polysilicon film, gettering ability of Fe and Cu is enhanced, and the diffusion preventing effect can be enhanced.

Second Embodiment

Figure 9:
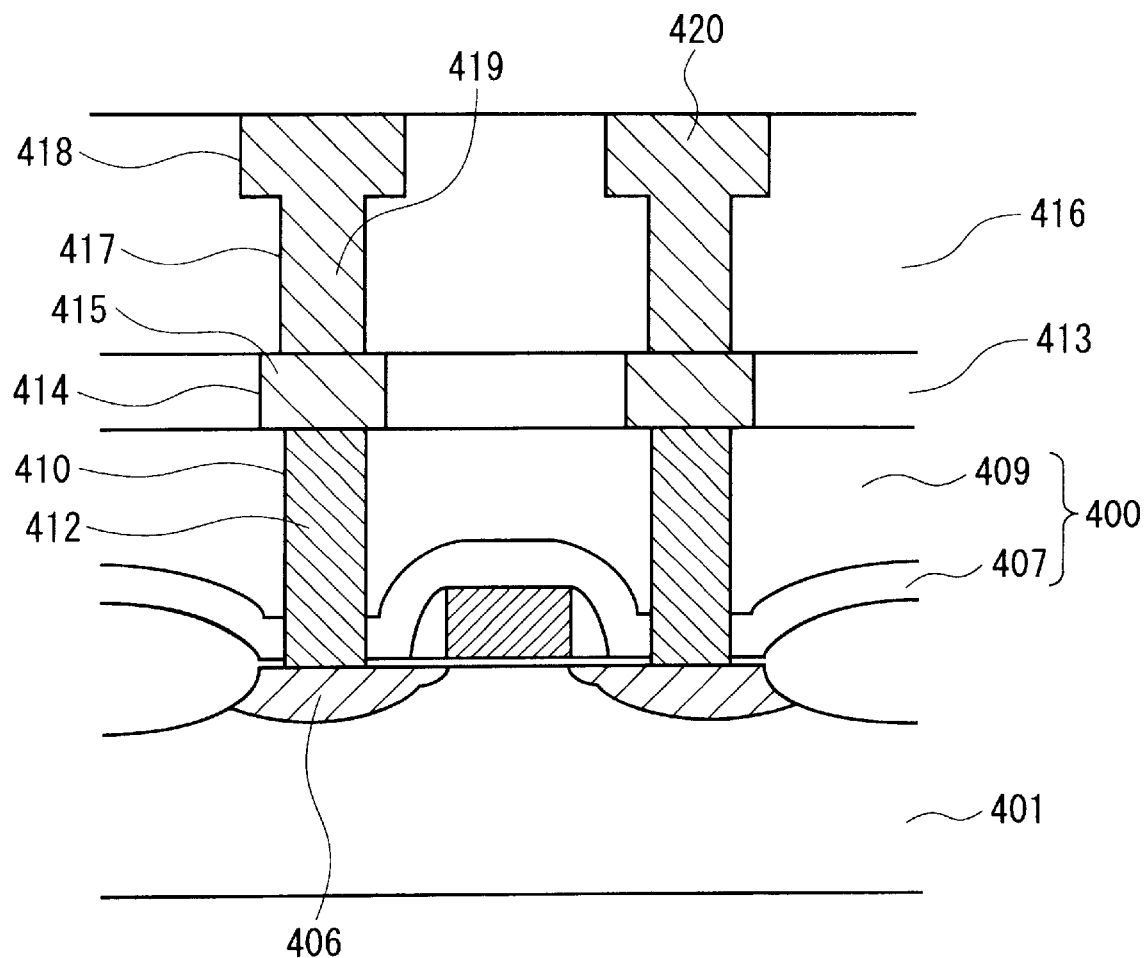
FIG. 9 is a sectional view of a structure of a conventional semiconductor device.

In the first embodiment, the interlayer film 100 is of the three-layer structure in which the polysilicon film 8 is sandwiched between the silicon oxide film 7 and the BPSG film 9 so as to obtain complete insulation. Further, the contact sidewall insulating film 11 is required for insulation also on the inner wall of the contact hole 10. Therefore, the number of steps is increased as compared with the conventional technique shown in FIG. 9. A semiconductor device that does not increase the number of steps as compared with the conventional technique will be shown below as a second embodiment of the invention.

Figure 8:
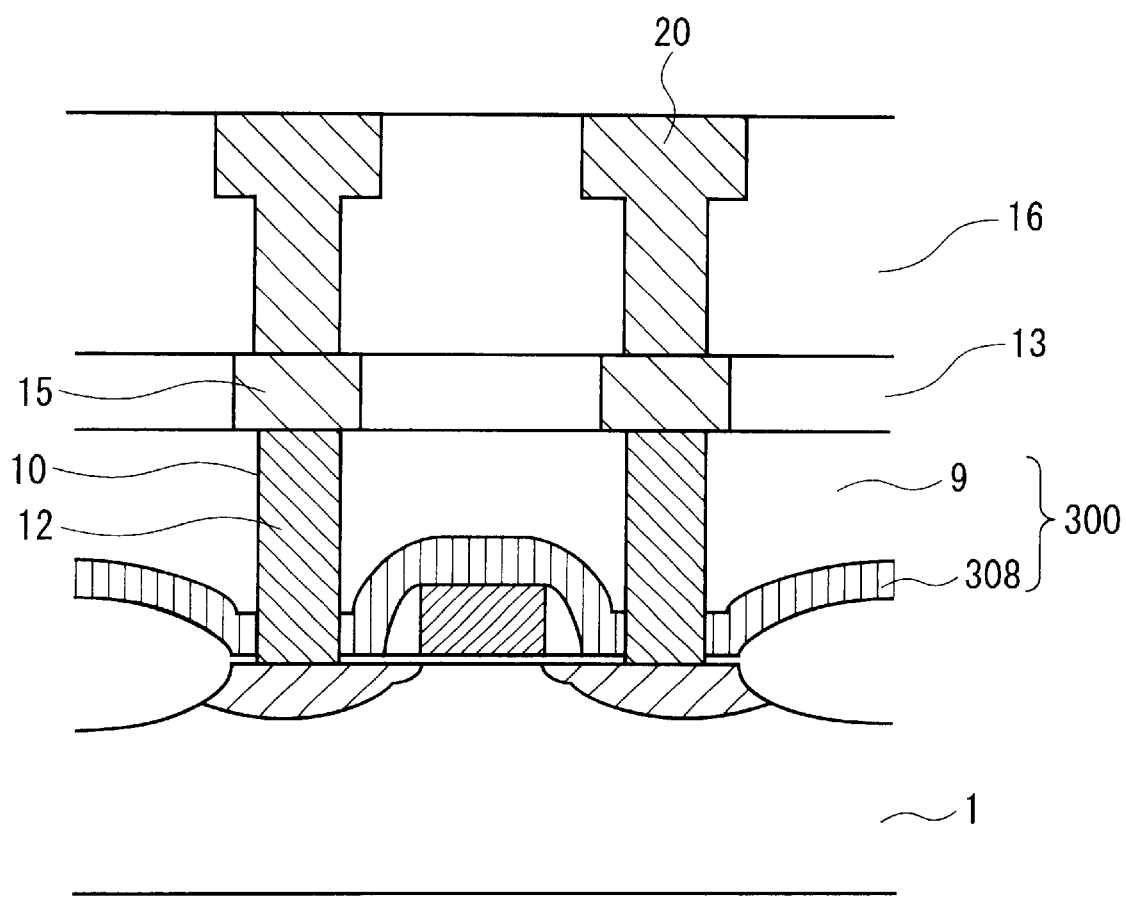
FIG. 8 is a sectional view of a structure of a semiconductor device according to a second embodiment of the invention.

FIG. 8 is a sectional view of a structure of a semiconductor device according to the second embodiment of the invention. In FIG. 8, an interlayer film 300 of a two-layer structure comprising a diffusion preventing film 308 and a BPSG film 9 is provided instead of the interlayer film 100 of the three-layer structure of the first embodiment. An SIPOS (semi-insulating polycrystalline silicon) film is used as the diffusion preventing film 308. The SIPOS film is a polysilicon film including O or N, and this film is a high insulating film having high resistance equal to 1E11 ohm/cm$^2$ or higher. Therefore, the SIPOS film 308 can be formed directly on the semiconductor device, and it is unnecessary to provide the insulating film on the inner wall of the contact hole 10. Therefore, the number of steps is not increased as compared with the conventional technique shown in FIG. 9. Since the SIPOS film 308 also includes a large number of crystal defects in the film like the polysilicon film, when the CMP is carried out for forming the W plug and when the CMP is carried out for forming the metal wires 15 and 20 by the damascene process, even if the metal impurities remained on the interlayer film diffuse toward the substrate, the SIPOS film getters the metal impurities and thus, it is possible to prevent the metal impurities from reaching the substrate.

The SIPOS film 308 in the second embodiment is formed by an LPCVD process using $SiH_4$ and $N_2O$ or $Si_2H_6$ and $N_2O$ as raw gas. Preferable thickness of the film 308 is 20 to 100 nm, and more preferably, 50 to 100 nm.

In the second embodiment, the SIPOS film having high insulating ability is used as the diffusion preventing film, so that it is unnecessary to form the insulating film on the inner wall of the contact hole. Therefore, this is effective for forming a fine contact hole.

Also when the SIPOS film is used as the diffusion preventing film, the SIPOS film may be doped with impurities such as B or P as is the case when the polysilicon film is used. In this case also, the gettering ability is enhanced as compared with non-doped SIPOS film. In this case, however, since the insulating ability of the SIPOS film is lowered, it is preferable to employ the structure having the insulating film on the device and the inner wall of the contact hole as shown in FIG. 1.

In the first and second embodiments, the interlayer film having the diffusion preventing film is of the three or two-layer structure. When a film having high insulating ability such as the non-doped SIPOS film is used, the interlayer film can be a single-layered diffusion preventing film.

Although the non-doped polysilicon film, the polysilicon film doped with impurities, the non-doped SIPOS film and the SIPOS film doped with impurities are indicated as the diffusion-preventing film in the above embodiments, the diffusion-preventing film is not limited to those, and another film can be used only if the film can getter the metal impurities invading from the above layers. A film having high gettering ability and high insulating ability is preferable because it is unnecessary to provide the insulating film on the contact hole.

In the embodiments, the interlayer film provided under the first layer of a metal wire 15 has the diffusion-preventing film. The insulating film 100, 300 itself can be formed from the diffusion-preventing film.

The metal wire is not limited to the Cu wire, and another metal film may be used.

As explained above, according to the present invention, the interlayer film formed under the metal wire has the diffusion-preventing film capable of gettering the metal impurities invading from upper layers, it is possible to prevent the metal impurities from diffusing toward the semiconductor substrate. Therefore, it is possible to prevent the characteristics of the device from being deteriorated and to enhance the characteristics and reliability of the device.

It is apparent that the present invention should not be limited to the above embodiments, and the invention can appropriately be changed within a scope of technical principles of the invention.

What is claimed is:

1. A semiconductor device comprising an interlayer film formed on a semiconductor substrate, wherein said interlayer film includes a diffusion-preventing film for preventing metal impurities invading from an upper portion of said interlayer film from reaching said semiconductor substrate, wherein a contact hole is provided in said interlayer film, a contact hole insulating film is formed on an inner wall of said contact hole.

2. A semiconductor device according to claim 1, wherein W is embedded in said contact hole.

3. The device of claim 1, wherein said interlayer film comprises a silicon oxide film, said diffusion-preventing film and a BPSG film.

4. A device of claim 1, wherein said diffusion-preventing film is a polysilicon film.

5. The device of claim 4, wherein said diffusion-preventing film is doped with boron or phosphorus.

6. A semiconductor device comprising an interlayer film formed on a semiconductor substrate, wherein said interlayer film includes a polysilicon diffusion-preventing film for preventing metal impurities invading from an upper portion of said interlayer film from reaching said semiconductor substrate, said diffusion-preventing film covering field oxide films, a gate electrode, and source/drain diffusion layers except where contact holes extend through said diffusion-preventing film to allow metal plugs to contact the source/drain diffusion layers.

7. A semiconductor device according to claim 6, wherein said diffusion-preventing film is doped with boron (B) or phosphorus (P).

8. A semiconductor device according to claim 6, wherein said interlayer film comprises a silicon oxide film, said polysilicon diffusion-preventing film and a BPSG film.

9. A semiconductor device according to claim 6, wherein an insulating film having a wire groove is provided on said interlayer film, and a metal wire is provided in said wire groove.

10. A semiconductor device according to claim 9, wherein said metal wire is a Cu wire.

11. A semiconductor device, comprising an interlayer film formed on a semiconductor substrate and covering field oxide films, a gate electrode, and source/drain diffusion layers, the interlayer film comprising a SIPOS diffusion-preventing film for preventing metal impurities invading from an upper portion of said interlayer film from reaching said semiconductor substrate.

12. The device of claim 11, further comprising:
   contact holes extending through the diffusion-preventing film, and
   metal plugs filling the contact holes and contacting the source/drain diffusion layers.

13. The device of claim 12, wherein the diffusion-preventing film is doped with boron or phosphorus.

14. The device of claim 12, wherein the metal plugs are W plugs.

* * * * *